(12) United States Patent
Kim

(10) Patent No.: US 7,602,031 B2
(45) Date of Patent: Oct. 13, 2009

(54) METHOD OF FABRICATING SEMICONDUCTOR DEVICE, AND SEMICONDUCTOR DEVICE

(75) Inventor: Young Suk Kim, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 159 days.

(21) Appl. No.: 11/135,467

(22) Filed: May 24, 2005

(65) Prior Publication Data

US 2006/0094196 A1      May 4, 2006

(30) Foreign Application Priority Data

Oct. 29, 2004   (JP)   ............... 2004-315211

(51) Int. Cl.
*H01L 29/76*   (2006.01)
(52) U.S. Cl. ...................... 257/413; 257/369
(58) Field of Classification Search ............... 257/412, 257/413, 382–384, 407, 369
See application file for complete search history.

(56) References Cited

U.S. PATENT DOCUMENTS

| | | | |
|---|---|---|---|
| 5,212,400 A * | 5/1993 | Joshi ........................... | 257/412 |
| 6,083,798 A * | 7/2000 | Lin ............................. | 438/297 |
| 6,335,280 B1 * | 1/2002 | van der Jeugd ............. | 438/674 |
| 6,929,992 B1 * | 8/2005 | Djomehri et al. ........... | 438/199 |
| 7,098,514 B2 * | 8/2006 | Oh et al. ..................... | 257/384 |
| 7,271,455 B2 * | 9/2007 | Cabral et al. ................ | 257/382 |

OTHER PUBLICATIONS

B. Tavel et al., "Totally Silicided ($CoSi_2$) Polysilicon: a novel approach to very low-resistive gate (~2Ω/□) without metal CMP nor etching" Technical Digest, International Electron Devices, Dec. 2-5, 2001, pp. 37. 5.1.
W.P. Maszara et al., International Electron Devices Meeting, Technical Digest, Dec. 8-11, 2002, pp. 367.
Qi Xiang et al., "Strained Silicon NMOS with Nickel-Silicide Metal Gate" VLSI Technology, Digest of Technical Papers, Jun. 10-12, 2003, pp. 101-102.

* cited by examiner

*Primary Examiner*—Mark Prenty
(74) *Attorney, Agent, or Firm*—Westerman, Hattori, Daniels & Adrian, LLP.

(57) ABSTRACT

Disclosed is a method of fabricating a semiconductor device that includes field effect transistors each having a gate electrode formed only of a metal silicide which overcomes the problem of depletion of the gate and makes adjustment of a work function easier, and that has a high integration with the existing process and a high cost performance. The method fabricates a semiconductor substrate, a gate electrode formed on the semiconductor substrate via a gate insulating layer, and a source and a drain having an elevated structure with the gate electrode in between, and includes a step at which the gate electrode is silicidized to form a metal silicide.

8 Claims, 17 Drawing Sheets

METHOD OF FABRICATING SEMICONDUCTOR DEVICE, AND SEMICONDUCTOR DEVICE

CROSS-REFERENCE TO RELATED APPLICATIONS

This application is based upon and claims the benefit of priority from the prior Japanese Patent Application No. 2004-315211, filed on Oct. 29, 2004, the entire contents of which are incorporated herein by reference.

BACKGROUND OF THE INVENTION

1) Field of the Invention

The present invention relates to a method of fabricating a semiconductor device, particularly, a semiconductor device that includes field effect transistors (MISFETs or MOSFETs) each of which is operable at a high speed and has a gate electrode formed of a metal silicide layer alone, and the semiconductor device.

2) Description of the Related Art

The recent microfabrication of semiconductor integrated circuit devices (hereinafter, simply referred to as "semiconductor devices") leads to miniaturization of the electrodes of semiconductor elements. To improve the drive performance of semiconductor elements, the metal silicide is formed on the top surfaces of the gate electrode, the source region and the drain region. To reduce the contact resistance between these regions and an overlying wire, metal silicides, such as titanium silicide, cobalt silicide, or nickel silicide, are used. To form the metal silicide, sides of the gate electrode are covered with a side wall spacer, a metal layer is deposited on the substrate, and the resultant structure is subjected to a heat treatment to thereby form a metal silicide on the gate electrode, the source region, and the drain region in a self-aligned manner.

As a partly silicidized polysilicon electrode is used for the gate electrode and the microfabrication makes the gate insulating layer thinner, impurity penetration would occur at the time of ion injection of an impurity, such as boron (B). If the concentration of B is made lower to prevent the penetration of B, depletion of the gate electrode occurs. A solution to this problem has been proposed, which uses a metal gate that does not cause depletion in place of the polysilicon electrode. The use of the metal gate can decrease the resistance of the gate electrode as well as overcome the problem of depletion, thereby ensuring smaller signal delay and power reduction.

Methods of fabricating a metal gate proposed include a method of depositing metal, instead of polysilicon, by sputtering and patterning the metal into the pattern of the gate electrode, and a damascene gate processing method using CMP (Chemical Mechanical Polishing). The sputtering method similar to the fabrication process for the current polysilicon electrode except for the electrode material involves multiple problems, such as difficulty in processing the metal electrode, degradation of the characteristic of the insulating layer caused by physical damages on the top surface, and reduction in the reliability of the gate insulating layer and the gate electrode by the activation process.

In case of the damascene gage process, however, after the transistor portion that is covered with an interlayer insulating layer is planarized by CMP, the dummy gate portion is selectively removed to form a gate insulating layer. Next, a metal layer (of, for example, TiN, WN, TaN, W or the like) is formed as the gate electrode, and is planarized by CMP, thereby forming a metal electrode. When a similar metal layer is used as the gate electrode, however, the work function of the gate electrode for an n-type MOSFET becomes equal to the work function for a p-type MOSFET. In case of a polysilicon gate, for example, with B and P (Phosphorus) injected, the work function for an n-type MOSFET becomes 4.05 eV and the work function for a p-type MOSFET becomes 5.17 eV. Therefore, the use of a similar metal layer makes it very difficult to adjust the threshold voltage. This requires a dual metal gate process which uses different metal materials for an n-type MOSFET and a p-type MOSFET as a gate electrode. Adequate control of the threshold voltage requires a material having a work function of 4.1 to 4.4 eV for the n-type gate electrode and a material having a work function of 4.8 to 5.1 eV for the p-type gate electrode. The requirement should face the difficulty of selecting the proper materials and the complexity of the process.

Recently, attention has been paid to a gate electrode formed only of silicide which facilitates adjustment of the work functions of an n-type MOS transistor and a p-type MOS transistor (see non-Patent Literatures 1 to 3: B. Tavel et al, International Electronic Devices Meeting Tech. Dig., 2001, pp. 37. 5.1; W. P. Maszara et al, International Electronic Devices Meeting Tech. Dig., 2002, pp. 367; and Qi Xiang et al, VLSI Technology, 2003. Digest of Technical Papers. 2003 Symposium on, 2003, Pages: 101 to 102, respectively). When a metal silicide layer is used as a gate electrode, its work function is the mid gap of silicon, which is desirable for the gate electrode. It is known that as the work function is controllable by an impurity in the polysilicon, the work function can be controlled according to each of an n-type MOS transistor and a p-type MOS transistor. In this respect, a semiconductor device fabricated by using the damascene gate process has been proposed to form a gate electrode only of a metal silicide layer. This semiconductor device is a device with the entire gate silicidized by silicidizing the source and drain regions and a part of the gate electrode first, then depositing an interlayer insulating layer, planarizing the interlayer insulating layer by CMP to expose the top surface of the gate electrode, depositing a metal layer to be silicide, and then subjecting the resultant structure to a heat treatment, as done according to the current silicidizing technology. The reason for the double silicidization is because the silicide of the gate electrode is thicker than the silicide of the source and drain regions. Silicidizing the source and drain regions according to the thickness of the silicide of the gate electrode at the same time increases the junction leak at the source and drain regions.

SUMMARY OF THE INVENTION

The present invention has been achieved to solve the above problems, and an object of the invention is to provide a method of fabricating a semiconductor device that has a gate electrode formed only of a metal silicide layer which overcomes the problem of depletion of the gate and makes adjustment of a work function easier, and that has a high integration with the existing fabrication method.

It is another object of the invention to provide a semiconductor device that includes field effect transistors (MISFET or MOSFET) using the fabrication method and has a high cost performance.

In order to solve the above problems, the present invention has a fabricating method according to the present invention is to fabricate a semiconductor device comprising a semiconductor substrate, a gate electrode formed on the semiconductor substrate via a gate insulating layer, and a source and a drain having an elevated structure with the gate electrode in between, and the method comprises a step at which the gate electrode is silicidized to form a metal silicide.

DETAILED DESCRIPTION OF THE PREFERRED EMBODIMENTS

Preferred embodiments of the present invention will be explained below in details with reference to the accompanying drawings. It should be noted that the explanations below are only exemplary embodiments of the invention, and changes and modifications can be easily made by persons skilled in the art within the scope of the appended claims. Furthermore, the explanations below will not limit the scope of the claims. The following will explain an n-type MOSFET, which of course becomes a p-type MOSFET if the conductivity types of the substrate and the impurity region are reversed, so that the same explanation will also be applied to a p-type MOSFET.

A semiconductor device according to the first embodiment of the present invention will be described below with reference to FIGS. 1 to 13. FIGS. 1 to 13 are schematic diagrams illustrating the steps of a fabrication method for a semiconductor substrate according to the embodiment.

First Embodiment

Figure 1:
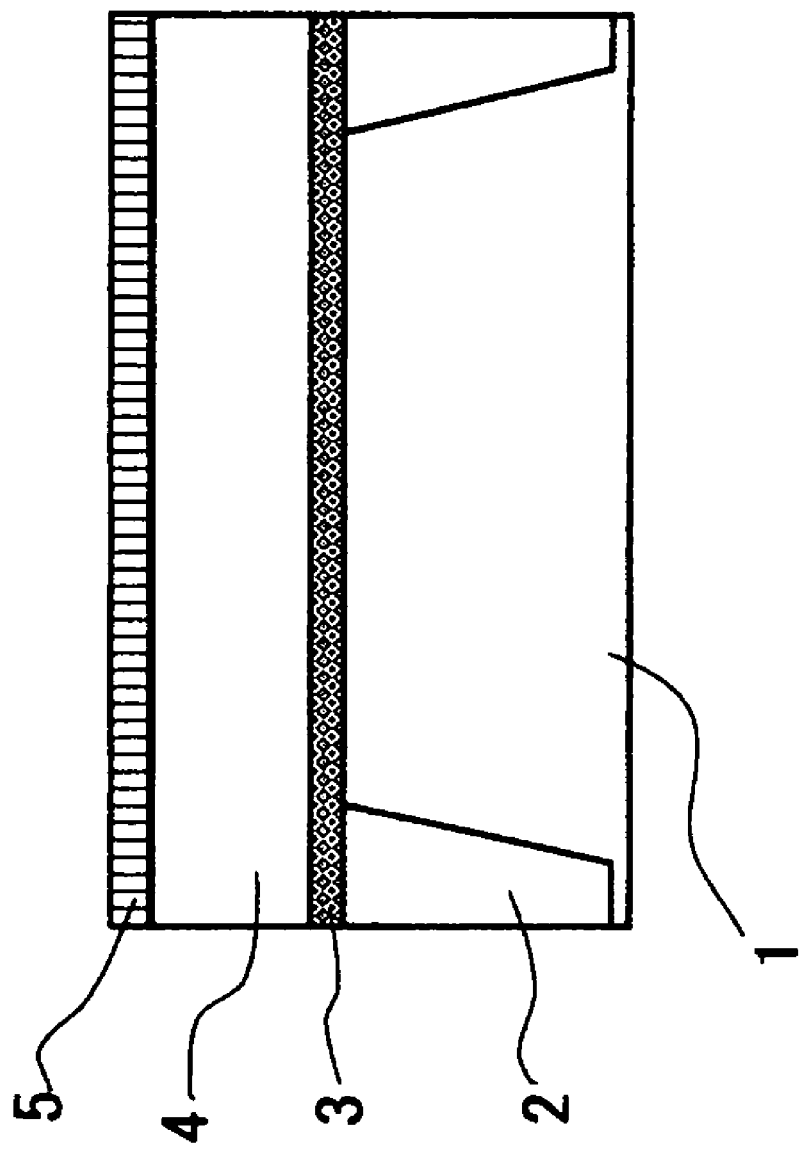
FIG. 1 is a diagram showing an element isolation region formed at a semiconductor substrate.

FIG. 1 is a diagram showing that an element isolation region for defining the region for a semiconductor element is formed at a semiconductor substrate of silicon. After fabrication and cleaning or the like of a semiconductor substrate 1, the semiconductor device is subjected to a semiconductor device fabricating process. First, an element isolation region for forming a semiconductor element (hereinafter occasionally referred to as "CMOS transistor") is formed in an element isolation process. The element isolation region isolates the semiconductor element with an insulating device isolation layer 2 formed. The device isolation layer 2 may be formed by, for example, LOCOS (Local Oxidation of Silicon) or STI (Shallow Trench Isolation). STI is preferable. The device isolation layer 2 of $SiO_2$ is formed by STI at both ends of a well portion where a semiconductor element is to be formed later.

Next, a photoresist layer (not shown) is applied to the semiconductor substrate 1 to pattern a gate electrode and wires or the like, and is exposed and developed to form a resist pattern. The photoresist layer can be formed by, for example, spin coating. Then, the photoresist layer is exposed with ultraviolet rays, a laser beam, an electron beam or the like to form an opening (not shown) to expose a region where an NMOS transistor is to be formed using the photolithography technology.

Next, with the photoresist layer used as a mask, a p-type dopant impurity is injected to form a p-type well in the semiconductor substrate 1 at that region where an NMOS transistor is to be formed. The conditions for ion injection may be the ion acceleration energy of 5 keV and the dose of $2\times10^{15}$ cm$^{-2}$. This can permit the CMOS transistor and its resistance to be adjusted. The resistance can be set to the desired value by adequately setting the ion injection conditions, such as the type of the dopant impurity and the dose thereof. Thereafter, the photoresist layer is removed. The removal of the photoresist layer is done by an ashing process or a wet process using sulfuric peroxide or ammonium peroxide.

Next, a gate insulating layer 3 is formed by forming an oxide layer on the entire surface of the semiconductor substrate 1. The gate insulating layer 3 can be formed by, for example, thermal oxidation. In the embodiment, the gate insulating layer 3 is formed to be 1.2 nm thick. Making the gate insulating layer 3 thinner to reduce the electric resistance can improve the circuit operation speed and can shorten the channel length. As the amount of the leak current with respect to the applied voltage increases, however, an insulator, such as an oxide, nitride or oxide nitride of a metal or plural metals, is used for the gate insulating layer 3. Preferably, any one of SiN, $SiO_2$, SiON, and high-k can be used. High-k which is an oxide of Hf, Zr, Y or the like is a more preferable choice because of its high insulation which can decrease the leak current and its high dielectric constant which can increase the amount of the current flowing in the semiconductor element.

Next, a polysilicon layer 4 with a thickness of 100 nm is formed on the entire surface. Instead of polysilicon (poly-Si), SiGe or SiGeC may be used as well for the film to be formed there. This prevents the gate insulating layer 3 from reacting with a metal silicide layer, which would otherwise deteriorate the breakdown voltage characteristic. Particularly, SiGe and SiGeC can prevent the threshold voltage from rising due to defects generated at the interface with the gate insulating layer 3 and the leak current from increasing.

Then, a silicon oxide layer 5 to be an etching mask 5 is deposited. A silicon nitride layer may be used as the etching mask 5.

Figure 2:
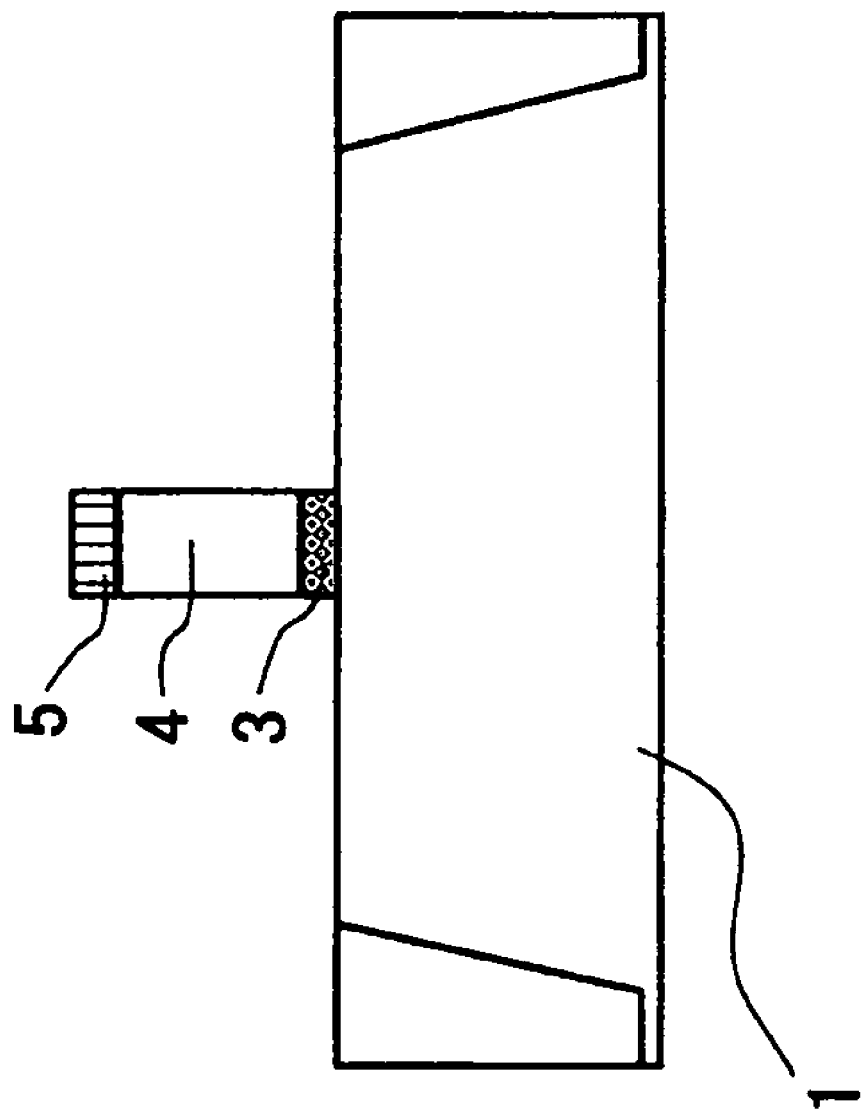
FIG. 2 is a diagram showing a cross-sectional structure when a polysilicon layer is patterned into the pattern of a gate electrode.

FIG. 2 is a diagram showing a cross-sectional structure when a polysilicon layer is patterned into the pattern of the gate electrode using photolithography technology. In the patterning, anisotropic etching, for example, is used. A gate electrode 4 of polysilicon is formed in this manner. It is desirable that the silicon oxide layer 5 should be left on the gate electrode 4 after patterning.

Figure 3:
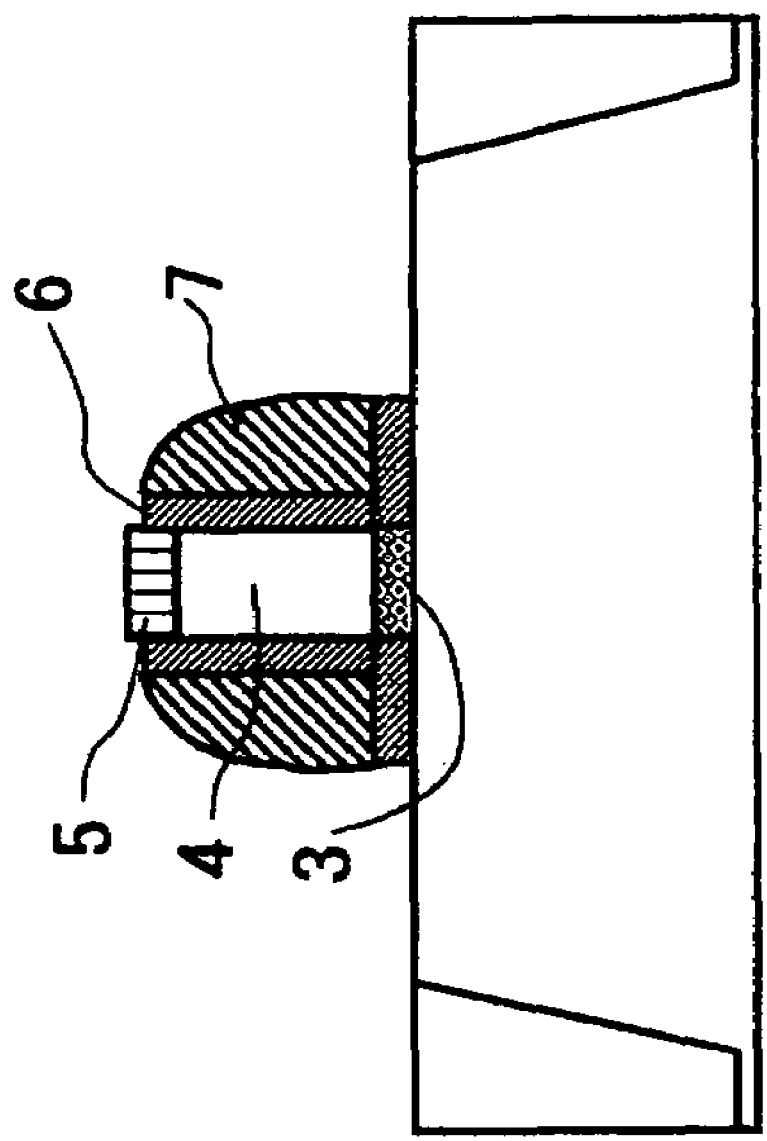
FIG. 3 is a diagram showing a first side wall spacer formed.

FIG. 3 is a cross-sectional view of a side wall spacer formed at the gate electrode. First, a silicon oxide layer 6 with a thickness of 5 to 30 nm is formed on the entire surface by thermal CVD. TEOS (tetraethoxysilane) is used as the source material. The deposition temperature is, for example, 550 to 700° C.

Next, likewise, a silicon nitride layer 7 with a thickness of 10 to 60 nm is formed by thermal CVD. $SiH_2Cl_2$ (dichlorosilane) is used as the source material. The deposition temperature is, for example, 600 to 800° C.

Next, the silicon nitride layer 7 and the silicon oxide layer 6 are subjected to anisotropic etching. Hydrofluorocarbon, for example, is used as the etching gas. Accordingly, a first side wall spacer with the lamination of the silicon oxide layer 6 and the silicon nitride layer 7 is formed at the side wall portions of the gate electrode.

Figure 4:
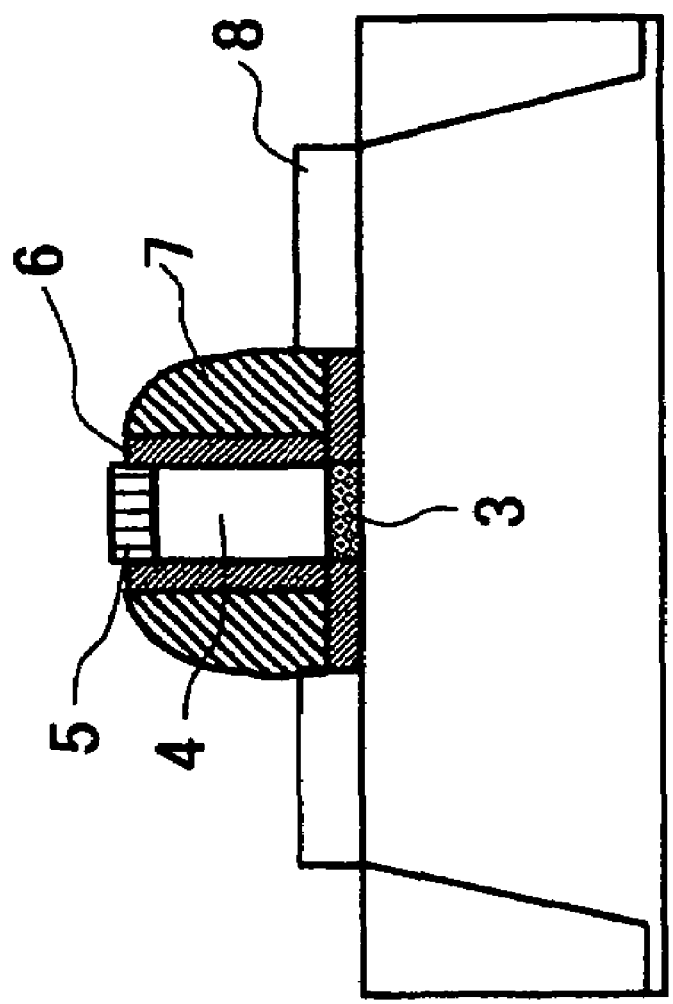
FIG. 4 is a diagram showing Si selectively deposited only at a source and a drain region.

FIG. 4 is a diagram showing Si selectively deposited only at the source region and the drain region. Because an oxide film is present on the top surface of the semiconductor substrate, epitaxial growth cannot be made, a pretreatment is performed with hydrofluoric acid to remove a natural oxide layer.

Next, with the first side wall spacer as a mask, Si is selectively deposited only on the source and drain regions. For example, $SiH_2Cl_2$, HCl or $H_2$ is used as the source material in reduced-pressure thermal CVD. The deposition temperature is, for example, 500 to 800° C. The pressure in the deposition chamber is, for example, 100 to 5000 Pa. The flow rate of $SiH_2Cl_2$ is 50 to 300 sccm. The flow rate of HCl is 30 to 300 sccm. $SiH_4$, $Si_2H_6$, $Si_3H_8$, and $Si_3Cl_6$ may be used in place of $SiH_2Cl_2$, and $Cl_2$ may be used in place of HCl. Accordingly, a source/drain portion 8 with an elevated source/drain structure (elevated source drain) of epitaxial Si is formed at the source/drain portion. In the elevated source/drain structure, an impurity diffusion layer with a high impurity concentration which is to be a source or a drain is formed above the channel region of the semiconductor element, and only an impurity diffusion layer with a low impurity concentration is present in the semiconductor substrate, so that a substantially shallow junction is formed. This can shorten the channel length. In addition, with the use of a silicide layer with a low resistance, the layer is formed on the monocrystalline epitaxial Si layer grown on the semiconductor substrate, so that the silicide layer can be formed thick by making the monocrystalline epitaxial Si layer thicker. This can reduce the parasitic resistance. Although the description has been given of a case where the elevated source/drain structure is formed using epitaxial Si, SiGe or SiGeC may be selectively deposited instead of epitaxial Si. In this case, $SiH_2Cl_2$, $GeH_4$, $SiCH_6$ (methylsilane), HCl or $H_2$ is used as the source material. The flow rate of $GeH_4$ is, for example, 50 to 300 sccm. The flow rate of $SiH_3CH_3$ is 2 to 50 sccm.

Figure 5:
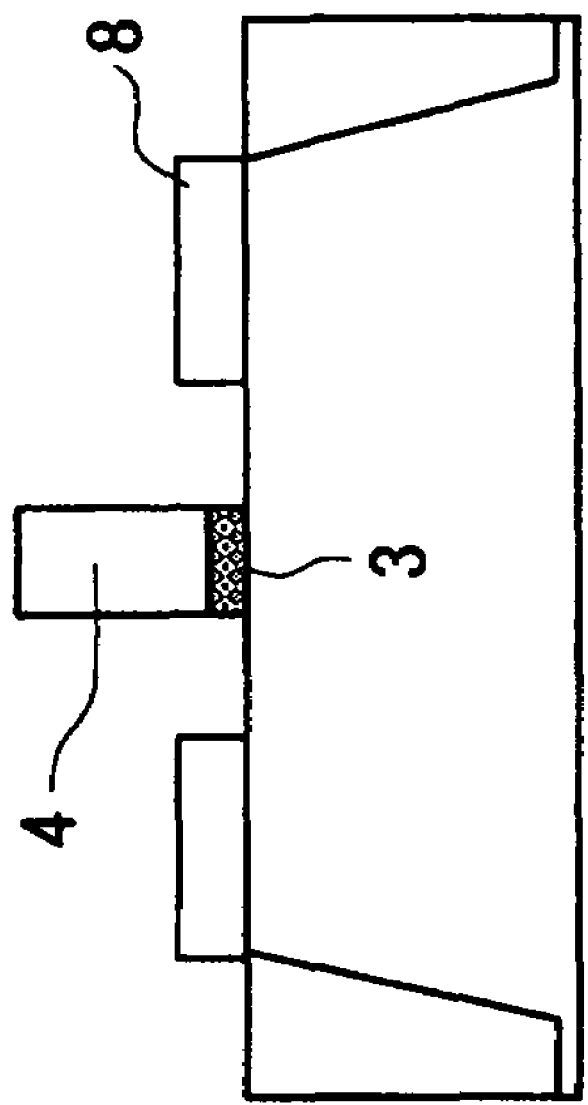
FIG. 5 is a diagram showing the first side wall spacer removed.

FIG. 5 is a diagram showing the first side wall spacer removed from the gate side wall where it was formed. According to the removal method, for example, the silicon nitride layer 7 is removed with phosphoric acid, and the silicon oxide layer 6 is removed with hydrofluoric acid or the like.

Figure 6:
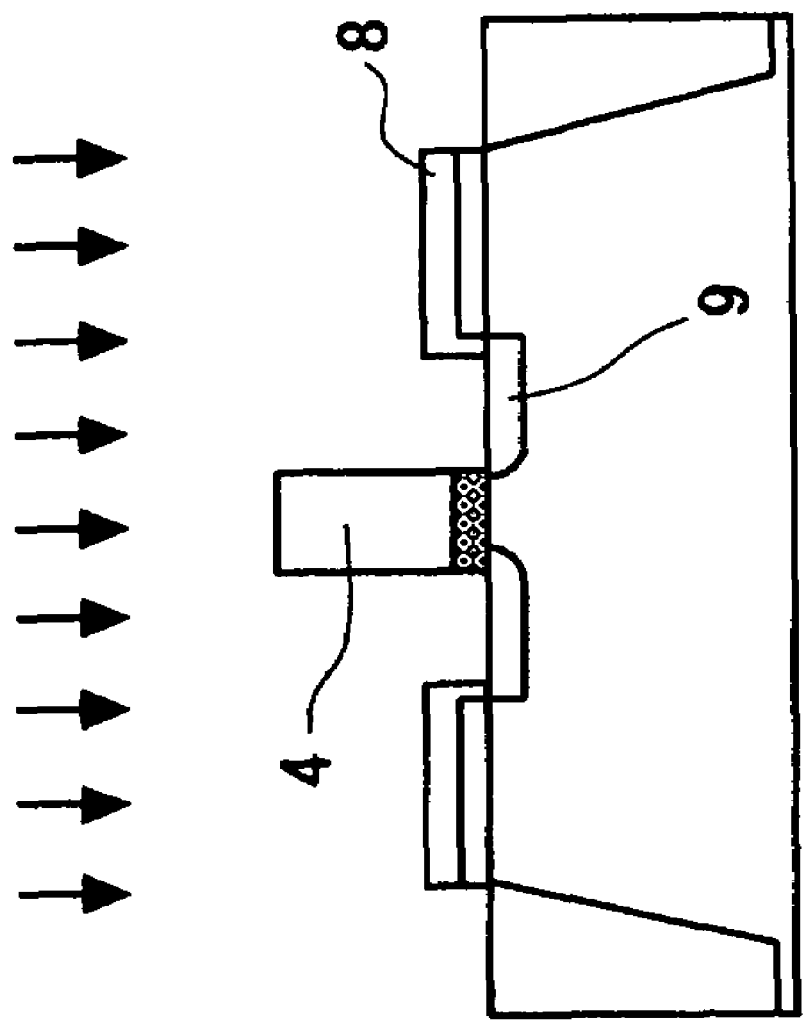
FIG. 6 is a diagram showing an extension region formed in the semiconductor substrate on both sides of the gate electrode.

FIG. 6 is a diagram showing an extension region formed in the semiconductor substrate on both sides of the gate electrode. First, a photoresist layer is formed on the entire surface by, for example, spin coating. Next, an opening is formed in that region of the photoresist layer where an n-type MOS transistor is to be formed by using the photolithography technology. Then, with the photoresist layer and the gate electrode 4 being masks, a p-type dopant impurity is injected into the semiconductor substrate 1 on both sides of the gate electrode 4. For example, In can be used as the p-type dopant impurity. The ion injection conditions are, for example, the ion acceleration energy of 50 keV and the dose of $5 \times 10^{13}$ $cm^{-2}$. A p-type pocket region is formed in the semiconductor substrate 1 on both sides of the gate electrode 4 in this manner. Next, with the photoresist layer and the gate electrode 4 being masks, an n-type dopant impurity is injected into the semiconductor substrate 1 on both sides of the gate electrode 4 by ion injection, for example.

As (arsenic), for example, can be used as the n-type dopant impurity. The ion injection conditions are, for example, the ion acceleration energy of 5 keV and the dose of $1 \times 10^{15}$ $cm^{-2}$. Thereafter, the photoresist layer is removed. As a result, an impurity diffusion region which constitutes a shallow region with an extension source/drain structure, i.e., an extension region 9, is formed in the semiconductor substrate 1 on both sides of the gate electrode 4.

Figure 7:
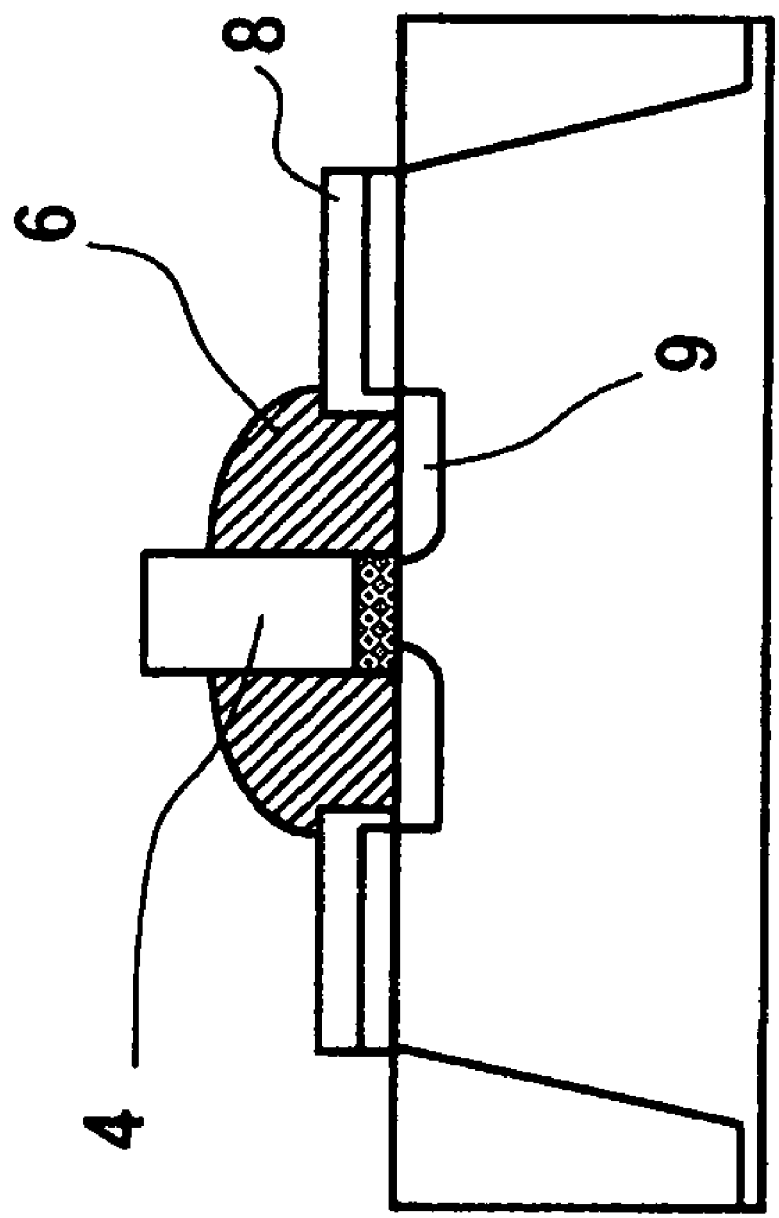
FIG. 7 is a diagram showing a second side wall spacer formed.

FIG. 7 is a diagram showing a second side wall spacer formed at side wall portions of the gate electrode. As shown in FIG. 7, a silicon oxide layer with a thickness of 50 to 100 nm is formed on the entire surface by thermal CVD. The silicon oxide layer is formed of BTBAS (bis(tertiary-butylamino) silane) and $O_2$, for example, used as the source materials at the deposition temperature of 500 to 580° C. Next, the second side wall spacer 6 comprised of a silicon oxide layer is formed on the side wall portions of the gate electrode 4 by anisotropic etching.

Although the description has been given of a case where the side wall spacer 6 is formed using a silicon oxide layer, a double-layer structure having a silicon oxide layer and a silicon nitride layer may be used in place of the silicon oxide layer.

Figure 8:
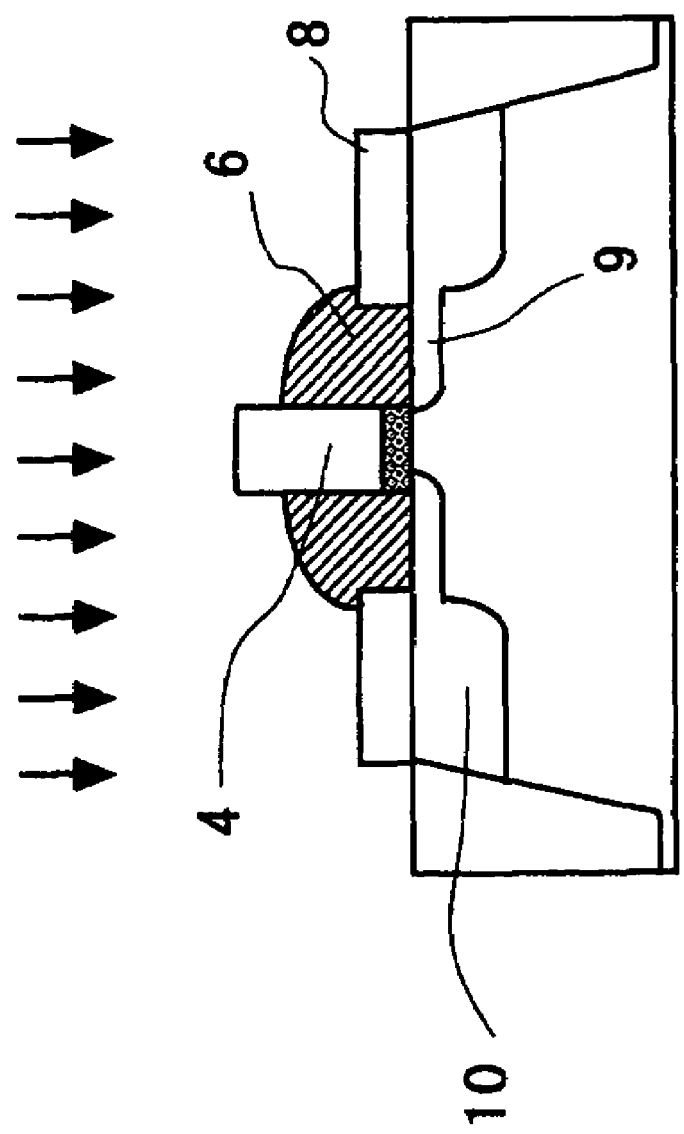
FIG. 8 is a diagram showing the source and drain region formed in the semiconductor substrate.

FIG. 8 is a diagram showing the source and drain region formed in the semiconductor substrate.

As shown in FIG. 8, after a photoresist layer is formed, an opening is formed in that region of the photoresist layer where an n-type MOS transistor is to be formed by using the photolithography technology. Then, with the photoresist layer, the gate electrode 4 and the second side wall spacer 6 being masks, an n-type dopant impurity is injected into the semiconductor substrate 1. For example, As or P can be used as the n-type dopant impurity. The ion injection conditions are, for example, the ion acceleration energy of 6 keV and the dose of $1 \times 10^{16}$ $cm^{-2}$. Thereafter, the photoresist layer is removed. As a result, an n-type impurity diffusion layer which constitutes a deep region with an extension source/drain structure, i.e., a source/drain region 10, is formed in the semiconductor substrate 1 on both sides of the gate electrode 4 on whose side wall portions the second side wall spacer 6 is formed.

Next, a heat treatment for activating the dopant impurity injected into the source/drain diffusion layer is done by, for example, RTA (Rapid Thermal Annealing). In the heat treatment, annealing is carried out for a short period of time at a temperature of, for example, 1000° C. or higher.

Figure 9:
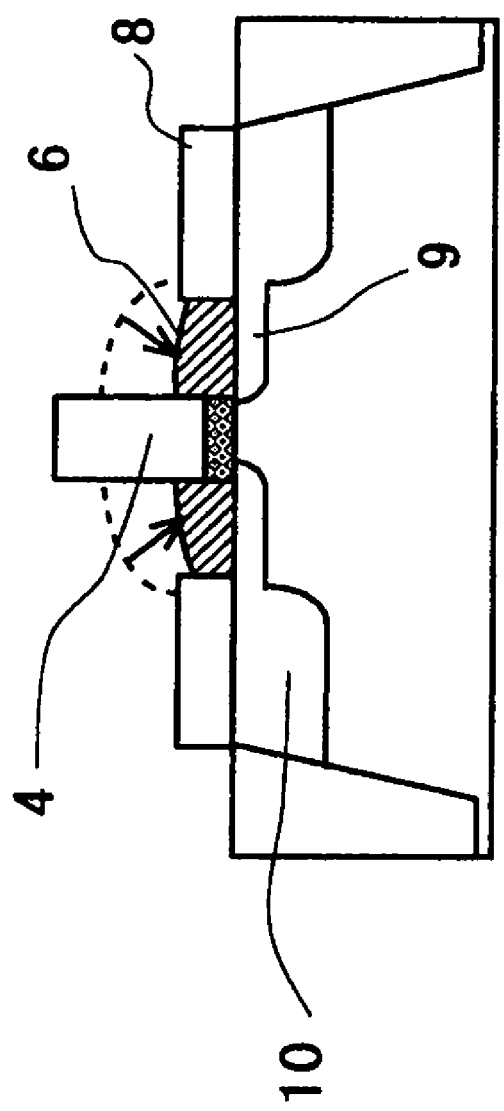
FIG. 9 is a diagram showing the second side wall spacer etched back.

FIG. 9 is a diagram showing the second side wall spacer etched back. When the side wall spacer 6 is comprised of a silicon oxide layer, for example, the side wall spacer 6 is etched with hydrofluoric acid or the like. The etching amount should be controlled in such a way that the whole side wall spacer 6 is not removed. The etching amount should be optimized by various parameters, such as the height of gate electrode, the height of the elevated source/drain, and the thickness of the side wall spacer.

Figure 10:
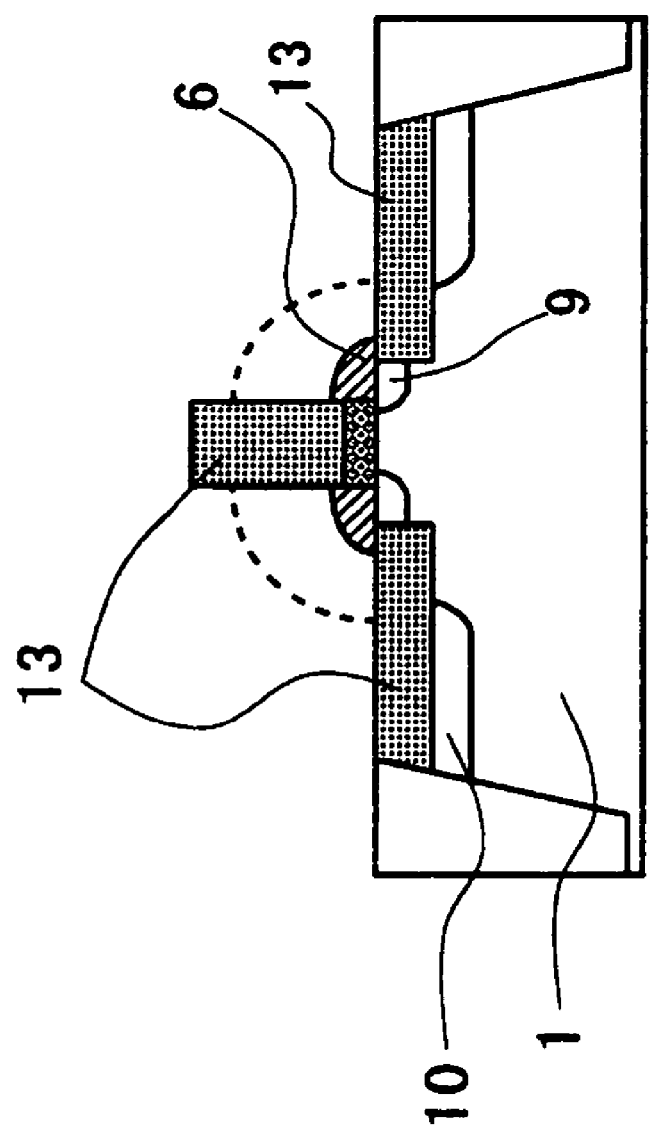
FIG. 10 is a diagram showing a side wall spacer etched back using an ordinary structure.

FIG. 10 is a diagram showing the side wall spacer etched back using an ordinary structure, not the elevated source/drain structure. In this case, as shown in FIG. 10, the side wall spacer 6 on that side of the semiconductor substrate 1 is etched back at the same time as the side walls of the gate electrode 4. If salicidization is carried out in this state, the salicidized portion comes very close to the channel, so that the short-channel effect becomes prominent, i.e., a problem, such as a change in threshold or reduction in reliability, arises.

According to the embodiment, an epitaxial layer is grown selectively only on the source and drain regions, thereby controlling the advancement of the metal silicide on the source and the drain toward the channel portion due to the etch-back of the side wall spacer. This makes it possible to control the gap between the source and the drain and the gate end and reduce the short-channel effect.

Figure 11:
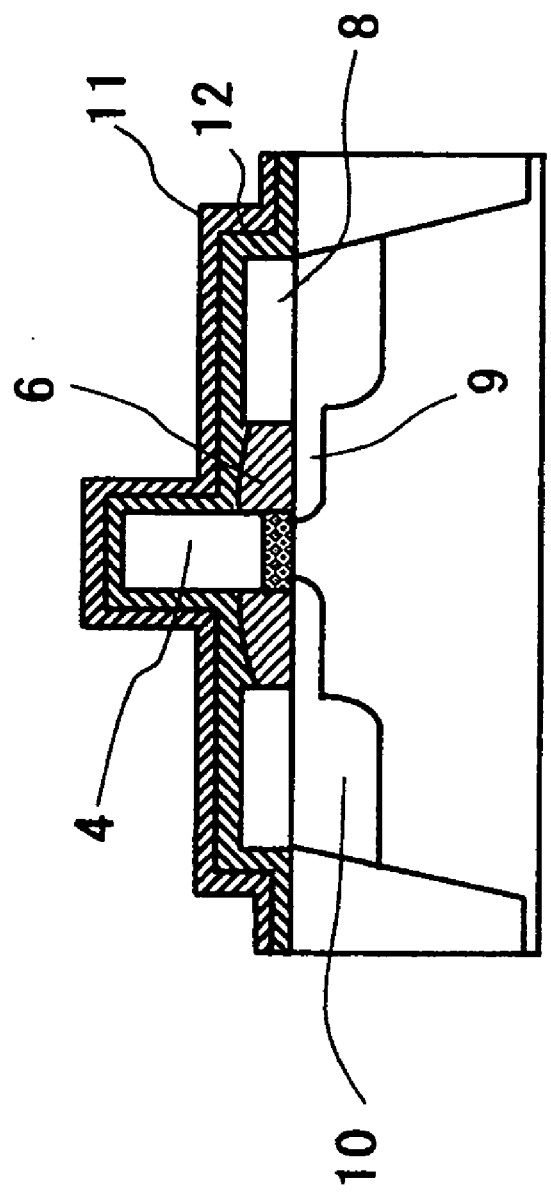
FIG. 11 is a diagram showing a process at which silicide is formed.

FIG. 11 is a diagram illustrating a process at which silicide is formed. A metal layer 12 of, for example, Ni, and an oxidization preventing layer 11 of TiN are deposited on the entire surface by, for example, sputtering. The thickness of the metal layer 12 of Ni is, for example, 10 nm, and the thickness of the oxidization preventing layer 11 of TiN is, for example, 20 nm. Although the description has been given of a case where silicide is formed using an Ni layer, Co may be used in place of Ni.

Figure 12:
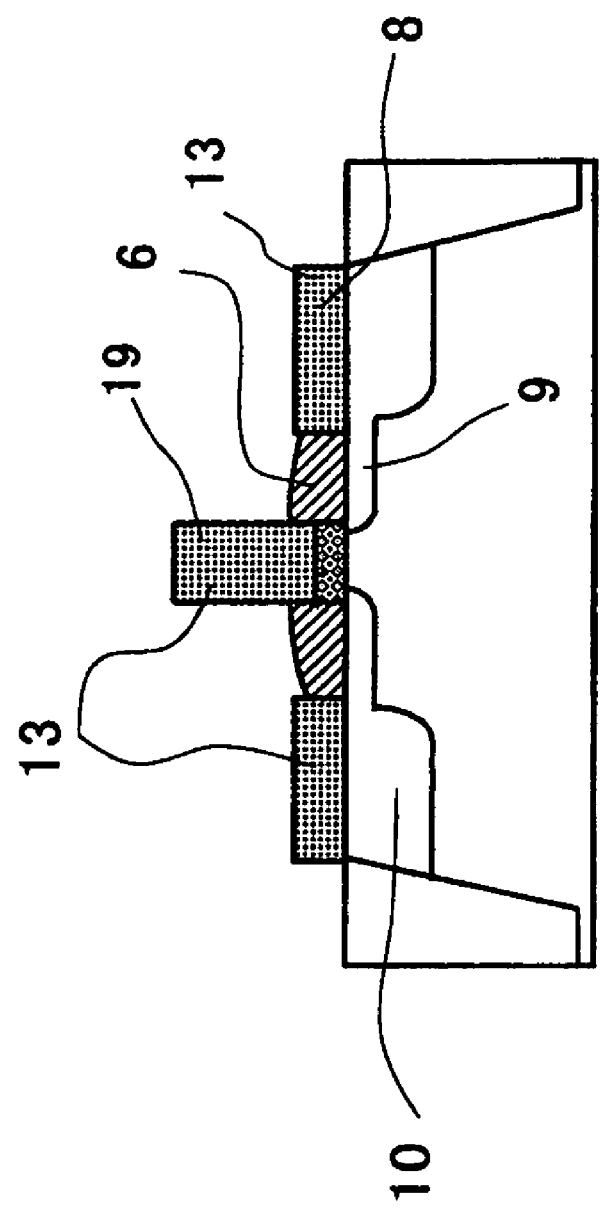
FIG. 12 is a diagram showing an MISFET according to the invention.

FIG. 12 is a diagram illustrating an MISFET according to the present invention. As shown in FIG. 12, the heat treatment next causes Ni in the metal layer to react with Si in the semiconductor substrate. As a result, NiSi (nickel silicide) layer, for example, is formed. Thereafter, the metal layer that has not reacted with Si is removed. Accordingly, a high-performance MISFET having a gate electrode 19 formed only of a metal silicide layer and also having a metal silicide layer on the source and the drain can be provided easily. The thickness of the gate electrode 19 and the thickness of a silicide layer 13 of the source/drain portion 8 can be controlled separately by controlling the etch-back amount of the oxide layer side wall spacer 6.

Figure 13:
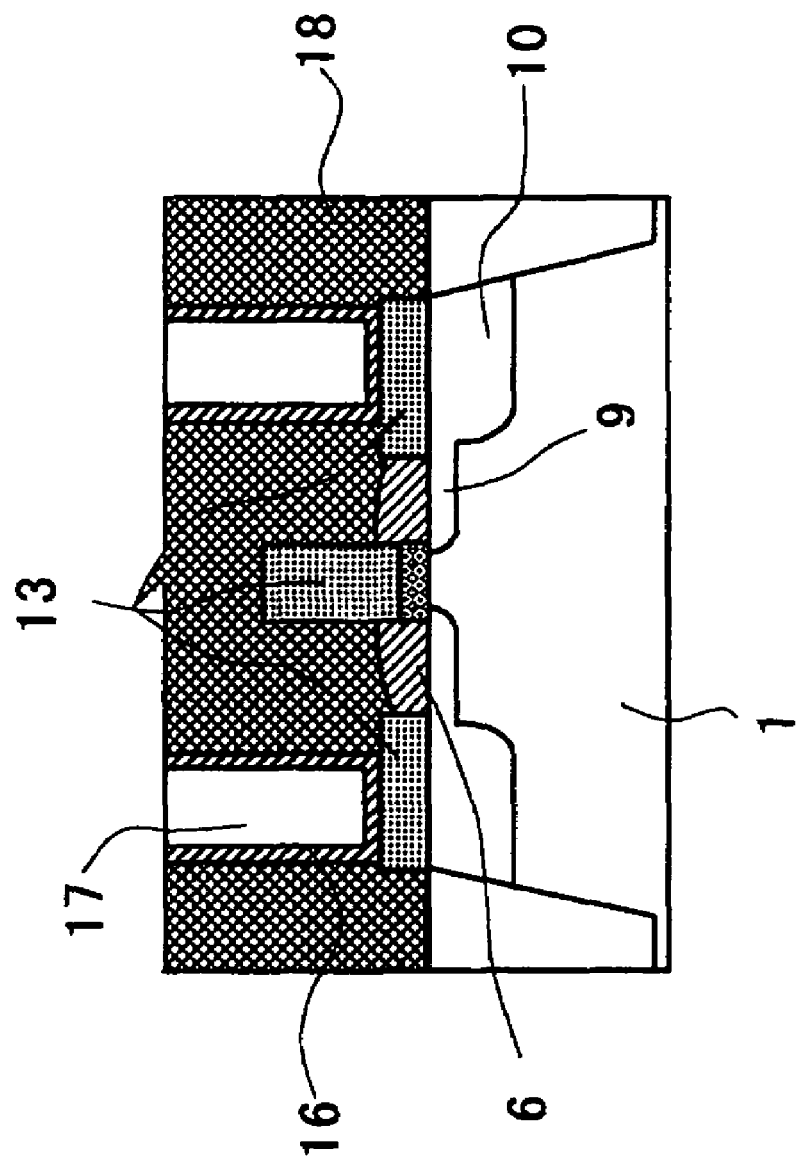
FIG. 13 is a diagram showing a cross-sectional structure of an MOSFET according to the present invention.

FIG. 13 is a diagram showing the cross-sectional structure of an MOSFET formed in a semiconductor device according to the embodiment. The MOSFET, like the ordinary MOSFET, is formed by, for example, planarizing the deposited interlayer insulating layer by CMP, forming a contact portion by etching, and burying a barrier metal 16 and W (tungsten) 17 in the contact portion.

The semiconductor device fabrication method according to the present invention, as apparent from the above, can silicidize the source and the drain and the gate electrode on the gate insulating layer at the same time to form the gate electrode such that the entire gate electrode on the gate insulating layer is comprised of a metal silicide layer, and can therefore provide a semiconductor device that overcomes the problem of depletion of the gate, can reduce the resistance of the gate electrode, which ensures smaller signal delay and power reduction. Further, the fabrication method can easily fabricate a gate electrode formed only of a metal silicide layer which facilitates adjustment of the work function, and has a high integration with the existing fabrication process, and a high cost performance.

In addition, as an epitaxial layer is selectively grown only on the source and the drain in the semiconductor device fabricated by the fabrication method, it is possible to control the advancement of the metal silicide on the source and the drain toward the channel portion due to the etch-back of the side wall spacer, thus reducing the short-channel effect, so that the semiconductor device fabricated has a high reliability.

A description will now be given of a semiconductor device having a first conductivity type MOSFET and a second conductivity type MOSFET on the same substrate.

Second Embodiment

Figure 14:
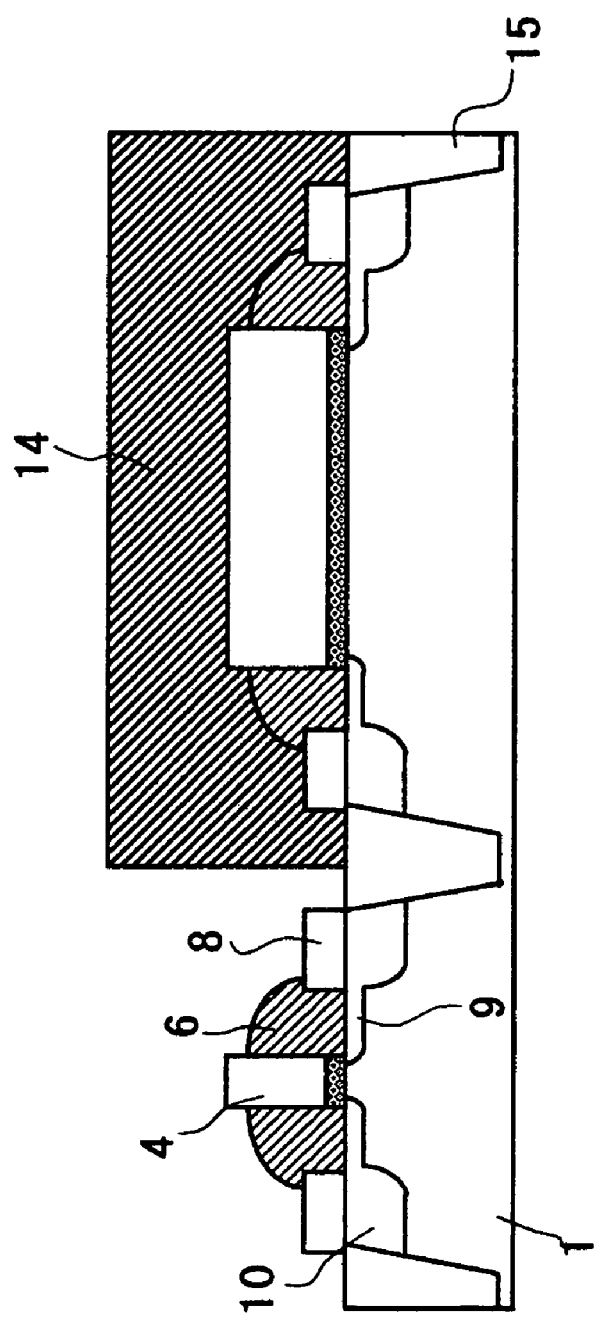
FIG. 14 is a diagram showing a short-channel MOSFET and a long-channel MOSFET according to the present invention formed at the same semiconductor substrate.
Figure 15:
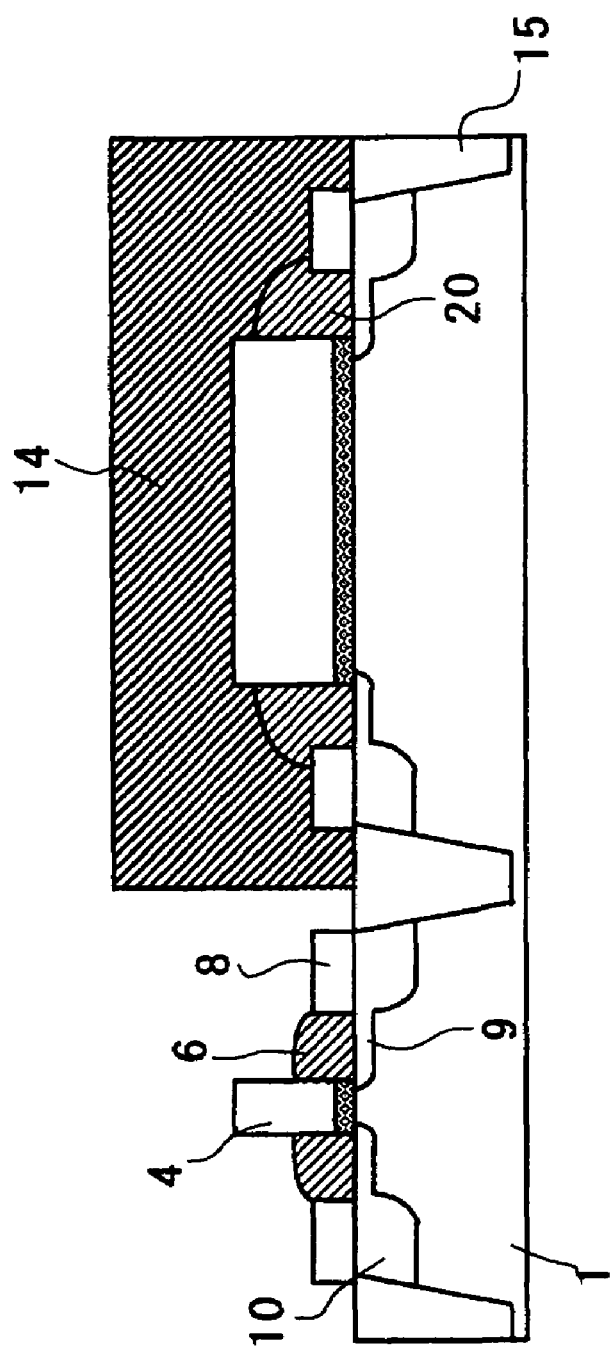
FIG. 15 is a diagram showing the second side wall spacer of the short-channel MOSFET according to the present invention etched back.
Figure 16:
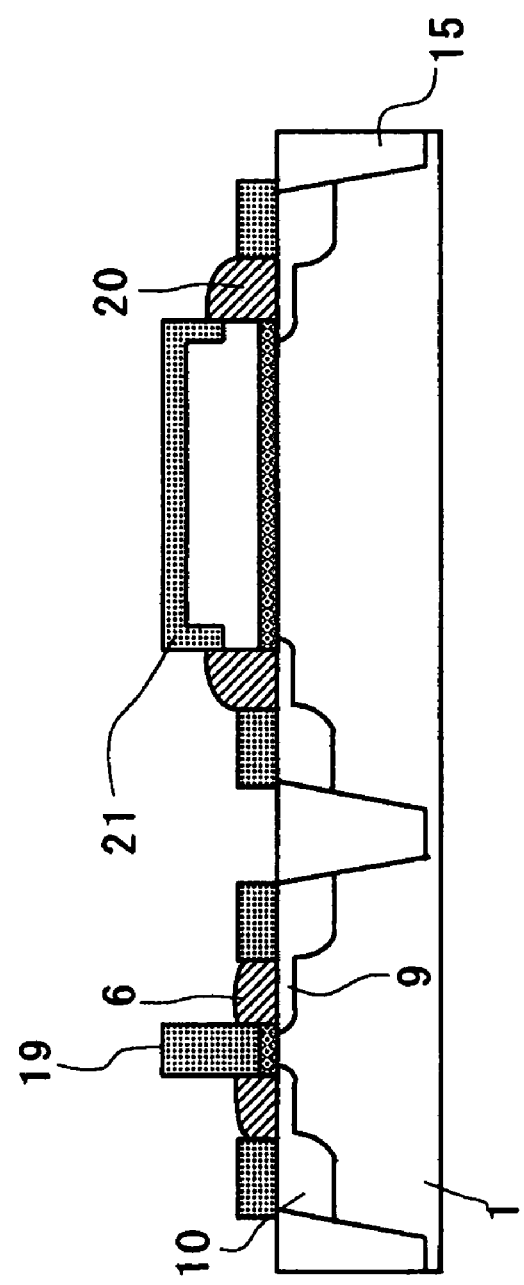
FIG. 16 is a diagram showing the structures of the short-channel MOSFET and the long-channel MOSFET according to the present invention.

A semiconductor device according to the second embodiment of the present invention will be described below with reference to FIGS. 14 to 16. FIGS. 14 to 16 are cross-sectional process views showing the semiconductor device according to the embodiment. The process up to FIG. 8 is the same as that of the first embodiment explained. The following description of the second embodiment explains a semiconductor device having a first gate electrode, wherein the etch-back amounts of the side wall spacers of a first conductivity type short-channel MOSFET and a second conductivity type long-channel MOSFET are controlled using masks in such a way that the entire gate electrode of the short-channel MOSFET alone is formed of metal silicide.

FIG. 14 is a diagram showing the short-channel MOSFET and the long-channel MOSFET formed at the same semiconductor substrate. As shown in FIG. 14, a photoresist layer 14 is formed on the entire surface by, for example, spin coating. Next, an opening is formed in that region of the photoresist layer 14 where the short-channel MOSFET is to be formed by using the photolithography technology.

FIG. 15 is a diagram showing the second side wall spacer of the short-channel MOSFET etched back. As shown in FIG. 15, with the photoresist layer 14 used as a mask, the second side wall spacer 6 of the short-channel MOSFET is etched back. When the side wall spacer 6 is comprised of a silicon oxide layer, for example, the side wall spacer 6 is etched by hydrofluoric acid or the like. At this time, the etching amount should be controlled in such a way as not to remove the whole side wall spacer 6. The etching amount should be optimized by various parameters, such as the height of gate electrode, the height of the elevated source/drain portion, and the thickness of the side wall spacer. This can provide a difference between the etch-back amount of the second side wall spacer 6 of the short-channel MOSFET and the etch-back amount of the second side wall spacer 20 of the long-channel MOSFET.

FIG. 16 is a diagram illustrating the structures of the short-channel MOSFET and the long-channel MOSFET.

As shown in FIG. 16, after removal of the photoresist layer, a metal layer of, for example, Ni, and an oxidization preventing layer of TiN are deposited on the entire surface by, for example, sputtering. The thickness of the metal layer of Ni is, for example, 10 nm, while the thickness of the oxidization preventing layer of TiN is, for example, 20 nm. Although the description has been given of a case where silicide is formed using an Ni layer, Co may be used in place of Ni. Next, a heat treatment is done to cause Ni in the metal layer to react with Si in the semiconductor substrate. As a result, NiSi (nickel silicide) layer, for example, is formed. Thereafter, the metal layer that has not reacted with Si is removed. This method can easily provide high-performance MOSFETs in which the short-channel MOSFET has a first gate electrode 19 formed only of a metal silicide layer and the long-channel MOSFET has a second gate electrode 21 only a part of which is formed of a metal silicide layer, and metal silicide is present also on the source and the drain.

As apparent from the above, different MOSFETs can be fabricated by controlling the etch-back amounts of the side wall spacers of the short-channel MOSFET and the long-channel MOSFET with the photoresist layer 14 used as a mask, so that inexpensive and high-performance semiconductor devices can be provided according to multifarious specifications.

Third Embodiment

A semiconductor device according to the third embodiment of the present invention will be described below with reference to FIG. 17.

Figure 17:
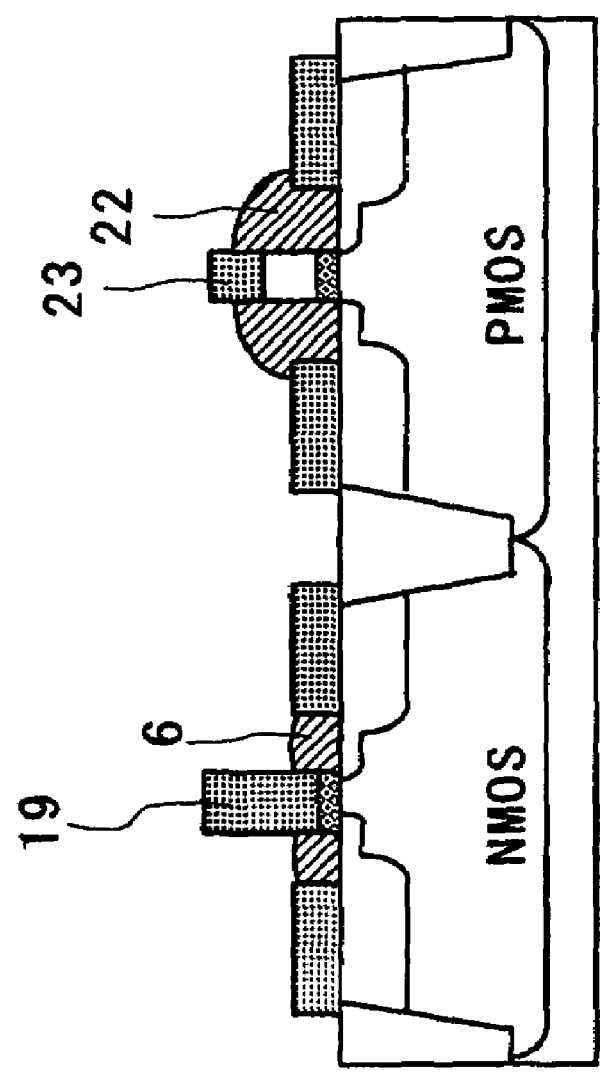
FIG. 17 is a diagram showing an n-channel MOSFET and a p-channel MOSFET according to the present invention formed at the same semiconductor substrate.

FIG. 17 is a diagram showing an n-channel MOSFET and a p-channel MOSFET according to the present invention formed on the same semiconductor substrate.

The process up to FIG. 8 is the same as that of the first embodiment described. The following description of the third embodiment explains a semiconductor device, wherein the etch-back amounts of the side wall spacers of the first conductivity type of n-type MOSFET and the second conductivity type of p-type MOSFET are controlled using masks in such a way that the entire gate electrode of the n-type MOSFET or the p-type MOSFET alone is formed of metal silicide. For example, a method of forming a gate electrode in such a way that the first gate electrode of the n-type MOSFET alone is entirely comprised of metal silicide will be explained.

A photoresist layer is formed on the entire surface by, for example, spin coating. Next, an opening is formed in that region of the photoresist layer where an n-type MOSFET is to be formed by using the photolithography technology. Then, with the photoresist layer used as a mask, the second side wall spacer of the n-type MOSFET is etched back. When the side wall spacer is comprised of a silicon oxide layer, for example, the side wall spacer is etched by hydrofluoric acid or the like. At this time, the etching amount should be controlled in such a way as not to remove the entire side wall spacer. The etching amount should be optimized by various parameters, such as the height of gate electrode, the height of the elevated source/drain portion, and the thickness of the side wall spacer. This can provide a difference between the etch-back amount of the second side wall spacer 6 of the n-type MOSFET and the etch-back amount of the second side wall spacer, 22, of the p-type MOSFET.

Next, after removal of the photoresist layer, a metal layer of, for example, Ni, and an oxidization preventing layer of TiN are deposited on the entire surface by, for example, sputtering. The thickness of the metal layer of Ni is, for example, 10 nm, while the thickness of the oxidization preventing layer of TiN is, for example, 20 nm. Although the description has been given of a case where silicide is formed using an Ni layer, Co may be used in place of Ni. Next, a heat treatment is done to cause Ni in the metal layer to react with Si in the semiconductor substrate. As a result, NiSi (nickel silicide) layer, for example, is formed. Thereafter, the metal layer that has not reacted with Si is removed. This method can easily provide high-performance MOSFETs in which the n-type MOSFET has the first gate electrode 19 formed only of a metal silicide layer and the p-type MOSFET has a second gate electrode 23 only a part of which is formed of a metal silicide layer, and metal silicide is present also on the source and the drain. Although the description has been given of an n-type MOSFET, a p-type MOSFET is provided by forming an opening in that region of the photoresist layer where the p-type MOSFET is to be formed.

As described above, different MOSFETs can be fabricated by controlling the etch-back amounts of the side wall spacers of the n-type MOSFET and the p-type MOSFET with the photoresist layer used as a mask, so that inexpensive and high-performance semiconductor devices can be provided according to multifarious specifications.

The semiconductor device fabrication method according to the present invention can easily fabricate a gate electrode formed only of a metal silicide layer which facilitates adjustment of the work function, and has a high integration with the existing fabrication process, and a high cost performance.

The semiconductor device according to the present invention overcomes the problem of depletion of the gate, and achieves reduction in the resistance of the gate electrode, which ensures smaller signal delay and power reduction. In addition, selectively growing an epitaxial layer only on the source and the drain can control the advancement of the metal silicide on the source and the drain toward the channel portion due to the etch-back of the side wall spacer.

What is claimed is:

1. A semiconductor device comprising:
   a semiconductor substrate;
   first and second gate electrodes formed on said semiconductor substrate via a gate insulating layer, each of the first and second electrodes having, on both sides thereof, first and second sidewall spacers comprising an insulator having silicon oxide, wherein the first sidewall spacers adjacent the first gate electrode are shorter than the second sidewall spacers adjacent the second gate electrode;
   sources and drains each having elevated structures with each of the gate electrodes in between,
   wherein the first gate electrode consists of a metal silicide layer, and the second gate electrode consists of a polysilicon layer and a metal silicide layer.

2. The semiconductor device according to claim 1, wherein the gate electrodes and the sources and the drains are silicidized simultaneously.

3. The semiconductor device according to claim 1, wherein said metal silicide layer is comprised of a material containing Co or Ni.

4. The semiconductor device according to claim 3, wherein the gate insulating layer is comprised of a material selected from SiN, SiO2, SiON, and high-k.

5. The semiconductor device according to claim 4, wherein an epitaxial film is selectively formed only on the sources and the drains.

6. A semiconductor device comprising:
   a semiconductor substrate;
   first and second gate electrodes formed on said semiconductor substrate via a gate insulating layer, each of the first and second gate electrodes having, on both sides thereof, first and second sidewall spacers comprising an insulator having silicon oxide, wherein the first sidewall spacers adjacent the first gate electrode are shorter than the second sidewall spacers adjacent the second gate electrode;

sources and drains each having elevated structures with each of the first and second gate electrodes in between, and wherein the first gate electrode is completely silicidized, and the second gate electrode only partly silicidized.

7. The semiconductor device according to claim 6, wherein the source and the drain formed with the first gate electrode in between contain a first conductivity type impurity.

8. The semiconductor device according to claim 6, wherein an uppermost surface of the sidewall spacer of the second gate electrode is lower than an uppermost surface of the second gate electrode.

\* \* \* \* \*

UNITED STATES PATENT AND TRADEMARK OFFICE
CERTIFICATE OF CORRECTION

PATENT NO. : 7,602,031 B2 Page 1 of 1
APPLICATION NO. : 11/135467
DATED : October 13, 2009
INVENTOR(S) : Young Suk Kim It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 307 days.

Signed and Sealed this

Fifth Day of October, 2010

David J. Kappos
*Director of the United States Patent and Trademark Office*